SIGNAL GENERATOR

Filed Sept. 14, 1953

INVENTOR.
WALTER J. CERVENY
DAVID S. WISE
BY Hudson, Boughton,
Williams, David & Hoffmann
ATTORNEYS

United States Patent Office 2,859,409

Patented Nov. 4, 1958

2,859,409

SIGNAL GENERATOR

Walter J. Cerveny and David S. Wise, Cleveland, Ohio, assignors to Cleveland Patents, Incorporated, Cleveland, Ohio, a corporation of Ohio Application September 14, 1953, Serial No. 379,758

6 Claims. (Cl. 332—30)

The present invention relates to signal generators and more particularly to a signal generator for producing a frequency modulated signal having a wide sweep.

Heretofore attempts have been made to frequency modulate oscillators by using a capacitor in the tuning circuit of the oscillator having a dielectric which is responsive to electric fields. The oscillator is frequency modulated by applying a varying unidirectional field to the capacitor thereby varying the capacity thereof and the frequency at which the oscillator oscillates. These oscillators have not been entirely satisfactory because of the difficulty of obtaining an output which is free of amplitude modulation, and of obtaining a wide symmetrical sweep about a center frequency.

The principal object of the present invention is the provision of a frequency modulated signal generator having a wide symmetrical sweep about a center frequency.

Another object of the present invention is the provision of a wide sweep frequency modulated generator which is substantially free of amplitude modulation.

Another object of the present invention is the provision of a new and improved frequency modulated signal generator comprising an oscillator having a novel means for determining the center frequency and sweep of the oscillations of the oscillator, which neans is purely electrical, stable in its characteristics, and permits uniform sweep on each side of the center frequency by the application of a varying voltage.

Another object of the present invention is the provision of a new and improved frequency modulated signal generator having a wide sweep about a center frequency comprising an oscillator in combination with a novel tuning circuit having inductance and capacitance for determining the frequency of oscillation of the oscillator, the tuning circuit including a capacitor having a field responsive dielectric and electrical means for varying the capacity of the condenser whereby the oscillator is frequency modulated with a wide sweep about a center frequency and means for compensating for the change in Q of the field responsive capacitor with increased frequencies for maintaining the voltage output constant.

A further object of the present invention is the provision of a new and improved frequency modulated oscillator having a capacitor forming part of the capacitance in the tuning circuit thereof whose capacity is variable by the application of a varying unidirectional field to frequency modulate the oscillator, the capacitor exhibiting stable characteristics and lack of hysteresis upon the application of a periodically varying voltage.

A still further object of the present invention is the provision of a new and improved electric field responsive titanate condenser having a Curie temperature of at least 40° C. and a reversible dielectric constant whereby the capacity of the condenser is independent of the direction of change of the applied voltage.

Other objects and advantages of the invention will be apparent from the following detailed description of the preferred form of the invention, reference being made to the accompanying drawings forming a part hereof, and wherein Fig. 1 is a perspective view of a condenser particularly suitable for use in accordance with the present invention;

The present invention contemplates a new and improved frequency modulated signal generator having a novel titanate capacitor in combination with the oscillator of the generator whereby a varying unidirectional potential may be applied to the capacitor to frequency modulate the oscillator through a wide sweep about a center frequency without amplitude modulation.

Figure 2:
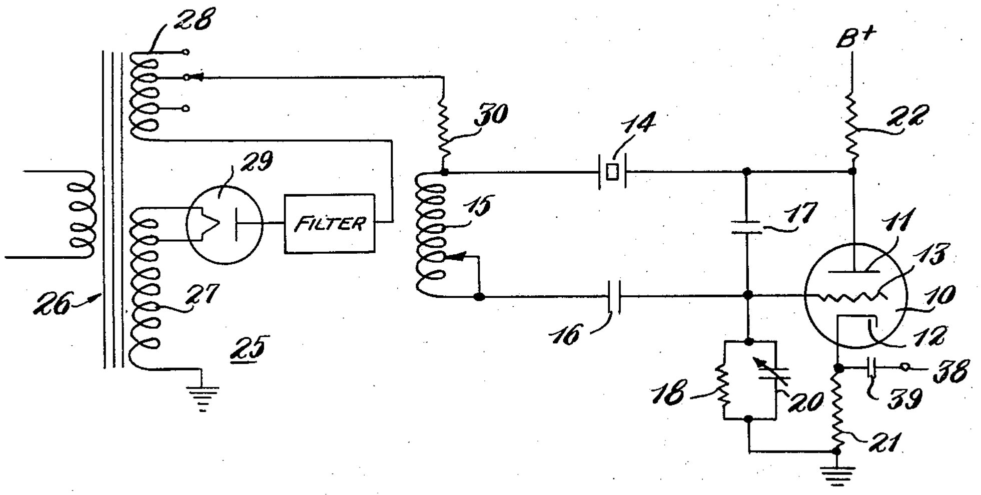
Fig. 2 is a schematic diagram of an oscillator embodying a capacitor according to the present invention.

Referring to Fig. 2, the preferred oscillator circuit for use in the signal generator comprises a triode 10 having an anode 11, a cathode 12 and a control element or grid 13. The anode 11 is connected to the grid 13 through a tuning or oscillation generating circuit comprising titanate capacitor 14, variable inductance coil 15 and fixed capacitance 16 connected in series. The variable inductance 15 is connected intermediate the capacitors 14, 16 with the capacitor 14 being also connected to the plate and the capacitor 16 to the grid of triode 10. A capacitor 17 is also connected directly between the plate and the grid of triode 10 in parallel with capacitor 14, inductor 15 and capacitor 16 and forms part of the capacitance of the oscillating circuit. The grid 13 is connected to ground through a parallel connected grid biasing resistor 18 and a variable capacitor 20. The purpose of capacitor 20 will be explained in detail hereinafter. The cathode 12 of triode 10 is connected to ground through a resistor 21. The oscillator is of the parallel feed type and the anode 11 is suitably connected to the B+ terminal of the power supply through plate load resistor 22.

The capacitor 14 has a titanate dielectric which is responsive to electric fields, variations in the electric field applied thereto causing variations in the capacity of the capacitor. By periodically varying the capacity of capacitor 14, the oscillations of the oscillator may be frequency modulated since the capacitor constitutes part of of the capacitance of the tuning circuit. In order to provide an oscillator having a wide sweep about a center frequency and one which is not subject to drift, the titanate dielectric capacitor 14 is one which has a large change of capacity per unit change of applied voltage, a Curie temperature of at least 40° C. and preferably less than 100° C., and a reversible dielectric constant whereby the capacitor is free from a hysteresis effect.

A varying unidirectional potential for varying the capacity of capacitor 14 is applied to the capacitor by a power supply means 25 which includes an A. C. transformer 26 having two windings 27, 28 forming the secondary thereof, the winding 28 having three taps. One side of the winding 27 is connected to ground while the other side is connected to the cathode of a rectifier tube 29. The anode of the rectifier tube 29 is connected to one side of the winding 28 through a suitable filter for substantially leveling the output of the rectifier. The other side of winding 28 is connected through a resistor 30 to a point intermediate the capacitor 14 and the inductor 15. The connection between the resistor 30 and the winding 28 may be made to one of the three taps to obtain different magnitudes of A. C. voltage superimposed upon the D. C. output of rectifier 29. The power means 25 preferably applies a D. C. bias of approximately 900 volts to the capacitor 14 and the superimposed A. C. voltage from winding 28 is of an order of magnitude sufficient to produce the desired sweep of the oscillator. It is apparent that if a symmetrical sweep about a center frequency is desired the D. C. bias must be sufficient to assure that the polarity of the capacitor 14 remains the same. The following table gives examples of titanate materials which are suitable for use as a dielectric of a capacitor to be utilized in the present invention.

| Component | Percent by weight | |
|---|---|---|
| | Example A | Example B |
| BaO | 51.74 | 63.07 |
| SrO | 4.28 | ---------- |
| CaO | 3.43 | ---------- |
| $TiO_2$ | 33.53 | 32.31 |
| $ZrO_2$ | 5.11 | ---------- |
| $SnO_2$ | ---------- | 2.64 |
| MgO | 0.20 | 1.20 |
| $Al_2O_3$ | 0.40 | 0.35 |
| $SiO_2$ | 1.42 | 0.42 |
| $Fe_2O_3$ | 0.05 | ---------- |

The analysis of the titanate materials which we have discovered as useful in frequency modulating an oscillator indicates that a material comprised essentially of alkaline earth titanates with minor additions of an oxide of a metal selected from the group consisting of zirconium and tin with barium titanate consisting approximately 85% of the titanates and the total of the alkaline earth titanates constituting at least approximately 90% of the material is satisfactory for use as a dielectric. In the above table, the alkaline earth titanates have been broken down and expressed as the oxides of titanium and the alkaline earth metal.

Figure 1:
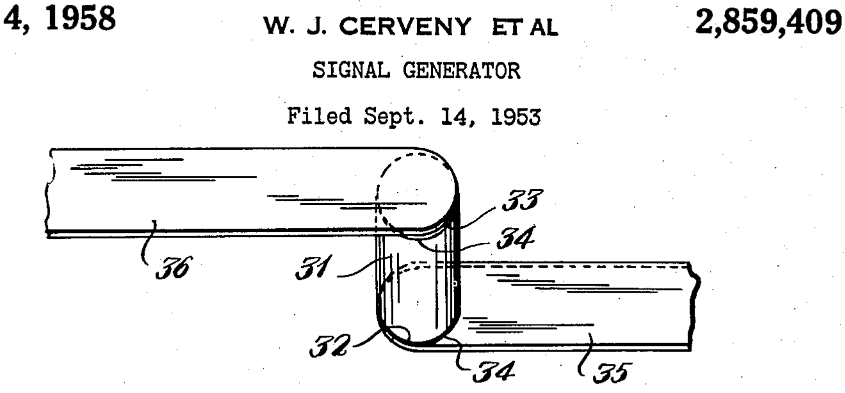

A capacitor made from the above dielectric is illustrated in Fig. 1 and comprises a dielectric body 31 which is generally cylindrical in configuration having opposed substantially parallel end faces 32, 33 which are generally transverse to the axis of the body 31. Each end face is coated with a coating or layer 34 of silver which may be applied thereto by the use of a silver paint which after application is fired to a temperature of approximately 1300° C. After the silver coating has been fired lead-in conductors 35, 36 may be soldered to the silver coating to complete the condenser. It is extremely important in manufacturing the condenser that the silver coatings 34 which are the electrodes of the condenser completely cover each end face of the dielectric body 31.

Figures 3, 4:
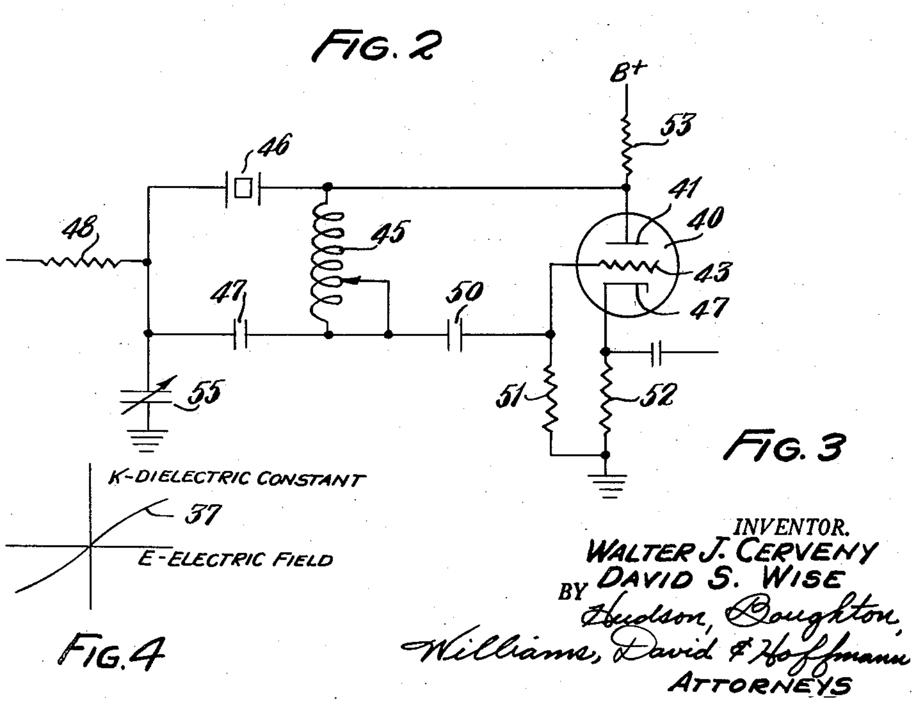
Fig. 3 shows a modified oscillator circuit embodying the present invention.
Fig. 4 shows the hysteresis curve of a titanate capacitor illustrated in Fig. 1.

Condensers having a dielectric body according to the above compositions and electrodes applied as above described exhibit characteristics which are free from a hysteresis effect. The nature of titanate materials is normally such that when used as a field responsive dielectric they exhibit an effect similar to the hysteresis effect in ferro-magnetic materials which would normally make them unsuitable for use in a frequency modulated generator since the dielectric constant must be reversible, i. e. independent of the direction of change of the voltage. A hysteresis curve of a titanate capacitor suitable for use in the tuning is shown in Fig. 4. It will be noted that the curve 37 is a line rather than a loop indicating a reversible dielectric constant. We have also found that it is important that the Curie temperature of the titanate material be at least 40° C., and preferably less than 100° C., when the condenser is to be used to frequency modulate a wide sweep signal generator.

As a matter of practice we have found that a D. C. bias of approximately 900 volts will cause the titanate capacitor constructed as above described to operate over that portion of its hysteresis curve where the weep of the generator will be symmetrical on either side of its center frequency. The best results were obtained with a capacitor of the order of 40 to 50 micro-microfarads measured without the application of the D. C. potential. The particular capacitor used was approximately .032" thick and .050" in diameter. In order to prevent the loading of the oscillator by the modulating voltage circuit the isolation resistor 30 must have a high impedance preferably of the order of one hundred thousand ohms. It is to be also noted that since the oscillator is modulated by varying the capacity of the tuning circuit the tuning of the oscillator over its prescribed frequency range must be accomplished by changing the value of the inductance in the tuning circuit.

The Q of titanate capacitors depends upon the magnitude of the voltage impressed thereon and increases with an increase in applied voltage. The capacitance of the titanate capacitor decreases with increasing applied voltage thereby increasing the frequency of the oscillator. This results in an increased Q for the titanate capacitor accompanying an increase in frequency of the oscillator which in turn results in increased oscillator efficiency and higher output at higher frequencies. We have found that the change of Q of the titanate capacitor may be compensated for if a capacitor is connected between the control element of the triode and ground. The change in the reactance of the capacitor 20 with the change in frequency maintains the voltage on the control element substantially constant eliminating amplitude modulation of the output signal. In the oscillator illustrated in Fig. 2 the capacitor 20 performs the above described function and is variable to allow the capacitance of the capacitor to be experimentally adjusted to that value which produces the necessary compensation for the change in Q of the titanate capacitor.

The output from the oscillator illustrated in Fig. 2, may be taken across the cathode resistor 21. An output terminal 38 is illustrated as being connected to the cathode through a coupling condenser 39. If desired the voltage output leveling condenser 20 may be connected in parallel with the cathode load resistor 21. For best results, however, the condenser 20 should be connected in parallel with the grid biasing resistor 18, as illustrated in the circuit diagram.

The schematic circuit diagram of Fig. 3 illustrates another form of oscillator embodying the present invention. The oscillator generally comprises a vacuum tube triode 40 having a plate 41, a cathode 42, and a control element or grid 43. The plate 41 is connected to the grid 43 through a tuning or oscillation generating circuit comprising variable inductance 45 connected in parallel with series connected capacitors 46, 47. The capacitor 46 is a titanate capacitor constructed as above described so that the application of a varying unidirectional voltage thereto will vary its capacity and frequency modulate the oscillator. The varying unidirectional potential is applied to the condenser 46 through an isolation resistor 47 having one side connected between the capacitor 46 and the capacitor 47 and the other side connected to the source of unidirectional potential which may be the same as that described in connection with the oscillator circuit shown in Fig. 1. The resistance of resistor 47 is preferably of the order of 100,000 ohms to prevent loading of the oscillator. In order to prevent the modulating voltage for varying the capacity of the capacitor 46 from being applied to the grid 43 of triode 40, a blocking condenser 50 is connected between the tuned circuit and the grid 43. The grid 43 is also connected to ground through a grid biasing resistor 51. The cathode 42 is connected to ground through a cathode resistor 52 and the anode 41 is connected to the B+ terminal of the power supply through a plate load resistor 53. The output of the oscillator may be taken across the cathode resistor 52, as in the case of the first described oscillator.

It has been found necessary in the circuit shown in Fig. 3 to connect a capacitor 55 between the oscillation generating circuit and ground in order to sustain oscillations. The capacitor 55 is connected into the oscillation generating circuit at a point between the capacitors 46, 47 and is made variable so that it may also be used to compensate for the change in Q of the titanate condenser 46. The capacitor 55 in compensating for the change of Q functions in the same manner as capacitor 20 of the first described oscillating circuit to maintain the voltage output of the oscillator constant for the sweep frequency range.

By utilizing oscillators embodying the present invention we have obtained frequency modulated signals having a center frequency between 30 and 1000 megacycles and a sweep of 75 megacycles. This sweep is necessary in testing wide band circuits such as those employed in television sets and we know of no reason why wider sweeps can not be obtained, if so desired, by utilizing larger capacity condensers. In addition the voltage output of the oscillator remains constant through the sweep range thereby providing a signal free of amplitude modulation.

In illustrated and described preferred embodiments of the present invention, only one titanate capacitor has been used in the tuning circuits for the oscillators. If desired more than one titanate capacitor could be used. For example, the capacitor 16 in Fig. 2 and the capacitor 47 in Fig. 3 could have a titanate dielectric with a varying applied field as will be well understood by those skilled in the art.

It will be seen from the above that we have provided a frequency modulated signal generator which has a wide sweep width about a center of frequency, is free of amplitude modulation, and is stable in its characteristics. Although various embodiments of oscillators embodying the present invention have been illustrated and described herein to a detailed extent, it will be understood, of course, that the invention is not to be regarded as being limited correspondingly in scope but includes all changes and modifications coming within the terms of the claims hereof.

Having thus described our invention, we claim:

1. In a frequency modulated signal generator, an oscillator comprising a vacuum tube having at least an anode, a cathode, and a control element, and a tuning circuit connected to said control element for defining the frequency of oscillation of said oscillator, said circuit comprising inductance and capacitance, a capacitor having a dielectric comprised of a titanate compound the dielectric constant of which is responsive to electric fields and the Curie point of which is between 40° C. and 100° C., said capacitor constituting at least part of said capacitance, means to impress a varying unidirectional potential across said capacitor for controlling and varying the frequency of oscillation of said oscillator, and means for maintaining the output of said oscillator at a predetermined level comprising a capacitor connected between said tuning circuit and ground for compensating for the change of Q of the titanate capacitor with a change of frequency whereby a constant voltage output is maintained over the sweep width of the oscillator.

2. In a frequency modulated signal generator, an oscillator comprising a vacuum tube having at least an anode, a cathode, and a control element, and a tuning circuit connected to said control element for controlling the frequency of oscillation of said oscillator, said circuit comprising inductance and capacitance, a capacitor having a dielectric whose dielectric constant varies according to variations in the applied electric field, said capacitor constituting at least part of said capacitance, means to impress a varying unidirectional potential across said capacitor, and means for compensating for the change of Q of said capacitor to maintain the voltage output of said oscillator constant comprising a capacitor the impedance of which is responsive to an increase in voltage on said control element and which is connected between said tuning circuit and ground.

3. In a frequency modulated signal generator, an oscillator comprising a vacuum tube having at least an anode, a cathode, and a control element, and a tuning circuit connected to said control element for controlling the frequency of oscillation of said oscillator, said circuit comprising inductance and capacitance, a capacitor having a field responsive dielectric whose dielectric constant varies in accordance with the variations in the electric field applied to the dielectric, said capacitor constituting at least part of said capacitance, means to impress a varying unidirectional potential across said capacitor to frequency modulate the oscillator, the dielectric constant of said capacitor as a function of the potential applied thereto being reversible for the range of operation of said generator, and means for maintaining the voltage output of said oscillator constant throughout the sweep width comprising an output leveling capacitor having one side electrically connected to ground and the other side electrically connected to said control element.

4. In a frequency modulated signal generator an oscillator comprising a vacuum tube having at least an anode, a cathode and a control element, means electrically connecting said anode to said control element including an inductance and capacitance for controlling the frequency of oscillation of said oscillator, a capacitor having a dielectric comprised of a titanate compound having a dielectric constant responsive to electric fields constituting at least part of said capacitance, means to apply a varying unidirectional potential across said condenser for varying the frequency of said oscillator, and means for maintaining the voltage output of said oscillator constant with change of frequency comprising a capacitor connected between said control element and ground.

5. In a frequency modulated signal generator having substantially constant voltage output and a wide sweep, an oscillator comprising a vacuum tube having at least an anode, a cathode and a control element, means connecting said anode to said control element including an inductance and capacitance for controlling the frequency of oscillation of said oscillator, a capacitor constituting at least part of said capacitance having a dielectric essentially comprised of barium titanate with minor additions of one of a group of $ZrO_2$ and $SnO_2$, said dielectric having a dielectric constant responsive to electric fields and a Curie temperature of at least 40° C., means for applying a varying unidirectional potential across said condenser to control the frequency and sweep of said oscillator, and means for maintaining the output of said oscillator constant throughout the sweep width comprising a capacitor connected between said control element and ground.

6. In a frequency modulated signal generator having a wide sweep and substantially constant voltage output throughout the sweep width, an oscillator comprising an electron discharge device having an anode, a cathode, and a control element, tuning means connected to said control element for determining the frequency of oscillation of said oscillator including a variable inductor and first and second series connected capacitors, said capacitors being connected in parallel with said inductor, one of said capacitors having a dielectric largely comprised of barium titanate with a Curie temperature of at least 40° C., a voltage source for supplying a varying unidirectional potential, means for imposing said potential on said titanate capacitor for varying the capacity thereof and frequency modulating said oscillator including a high resistance resistor having one side connected to said titanate capacitor at a point between said first and second capacitors, and a variable capacitor connected between said first and second capacitors and ground constituting part of the capacitance of said tuning means and compensating for the change of Q of said titanate capacitor with frequency whereby the output of said oscillator is substantially constant over the sweep range.

References Cited in the file of this patent

UNITED STATES PATENTS

| | | |
|---|---|---|
| 2,182,377 | Guanella | Dec. 5, 1939 |
| 2,461,307 | Antalek | Feb. 8, 1949 |
| 2,473,556 | Wiley | June 21, 1949 |
| 2,526,207 | Donley et al. | Oct. 17, 1950 |
| 2,563,307 | Burnham | Aug. 7, 1951 |
| 2,624,853 | Page | Jan. 6, 1953 |
| 2,648,823 | Kock | Aug. 11, 1953 |
| 2,719,223 | Van der Ziel | Sept. 27, 1955 |

OTHER REFERENCES

Effect of Field Strength in Dielectric Properties of Barium Strontium Titanate, by J. L. Donley, RCA Review, September 1947, pages 539–553.

"High Dielectric Constant Dielectrics," by Von Hippel, Industrial and Engineering Chemistry, vol. 38, No. 11, November 1946, pages 1097 to 1109.

National Bureau of Standards Research Paper, R. P. 1776, vol. 38, March 1947, Journal of the National Bureau of Standards.